(12) United States Patent
Sherry

(10) Patent No.: US 9,330,150 B1
(45) Date of Patent: May 3, 2016

(54) REGISTRATION AND UTILIZATION OF ARBITRARY DATA CONVERSION SCHEMES IN A SHARED DATA STORE

(71) Applicant: Gavin Sherry, San Mateo, CA (US)

(72) Inventor: Gavin Sherry, San Mateo, CA (US)

(73) Assignee: EMC Corporation, Hopkinton, MA (US)

( * ) Notice: Subject to any disclaimer, the term of this patent is extended or adjusted under 35 U.S.C. 154(b) by 234 days.

(21) Appl. No.: 13/777,226

(22) Filed: Feb. 26, 2013

(51) Int. Cl.
*G06F 17/30* (2006.01)
*H03M 7/30* (2006.01)

(52) U.S. Cl.
CPC .......... *G06F 17/30569* (2013.01); *H03M 7/30* (2013.01)

(58) Field of Classification Search
None
See application file for complete search history.

(56) References Cited

U.S. PATENT DOCUMENTS

| | | | |
|---|---|---|---|
| 5,734,885 A * | 3/1998 | Agrawal et al. | |
| 6,324,683 B1 * | 11/2001 | Fuh et al. | 717/124 |
| 2003/0033439 A1 * | 2/2003 | Menon et al. | 709/310 |
| 2003/0225935 A1 * | 12/2003 | Rivard et al. | 709/328 |
| 2008/0021914 A1 * | 1/2008 | Davies et al. | 707/101 |
| 2012/0078860 A1 * | 3/2012 | Roberts et al. | 707/693 |
| 2012/0239612 A1 * | 9/2012 | George et al. | 707/602 |
| 2013/0191650 A1 * | 7/2013 | Balakrishnan et al. | 713/190 |

OTHER PUBLICATIONS

"Linkage editor", Computer Desktop Encyclopedia, The Computer Language Company, accessed on Nov. 22, 2014 from: http://lookup.computerlanguage.com/host_app/search?cid=C999999&term=linkage+editor&lookup=Go.*
"Object code", Computer Desktop Encyclopedia, The Computer Language Company, accessed on Nov. 22, 2014 from: http://lookup.computerlanguage.com/host_app/search?cid=C999999&term=object+code&lookup.x=0&lookup.y=0.*
Stephens, Ryan et al., "Sams Teach Yourself SQL in 24 Hours", Aug. 12, 2002, Sams, 3rd Edition, pertinent section: "Hour 21. Working with the System Catalog", accessed on Nov. 22, 2014 from: http://www.informit.com/library/library.aspx?b=STY_Sql_24hours.*
"Descriptor", Computer Desktop Encyclopedia, The Computer Language Company, accessed on Nov. 24, 2014 from: http://lookup.computerlanguage.com/host_app/search?cid=C999999&term=descriptor&lookup.x=0&lookup.y=0.*

* cited by examiner

*Primary Examiner* — Alex Gofman
*Assistant Examiner* — Umar Mian
(74) *Attorney, Agent, or Firm* — Barry N. Young

(57) ABSTRACT

Data conversion algorithms such as compression and decompression algorithms or encryption and decryption algorithms are registered in a shared data store for selective use on data by creating implementations of a plurality of functions that as a group characterize the algorithms, converting the implementations to executable code and storing the code in a shared library, and creating and registering data store objects in a data store catalog with a common identifier that enables the algorithm to be selectively called and applied to data.

18 Claims, 4 Drawing Sheets

REGISTRATION AND UTILIZATION OF ARBITRARY DATA CONVERSION SCHEMES IN A SHARED DATA STORE

BACKGROUND

This invention relates generally to shared data stores, and more particularly to registering and using data conversion algorithms such as for compression/decompression or encryption/decryption of data in large shared data stores, such as data warehouses.

It is known in the data storage industry to compress data in order to conserve storage space on disk drives, particularly large data stores, and to reduce access time. Most data stores (databases) have a several different built-in compression algorithms which may be selected by users to compress data. These compression algorithms are typically generic, well known, general-purpose compression algorithms that are capable of doing a reasonable job of compressing a variety of different types of data. Some of these general-purpose compression algorithms are better suited for compressing certain types of data such as, for example, numerical data or textual data, than other types of data, which is why several different compression algorithms may be made available to users. Large data stores, however, generally store many different types of data which may have very different compression needs. General-purpose compression algorithms may not be well suited to some of these compression needs, or to the structure of the underlying data or to the data domain. Accordingly, they may not be very time efficient space-wise or time-wise, which affects database performance. Further, they may not provide the level or the quality of the compression desired for different types of data and different data domains, and may actually degrade the data.

Although it is possible for users to have custom special-purpose user-defined compression algorithms incorporated into their data stores to meet particular needs, with presently available databases providing custom built-in compression algorithms requires modification of the database code which is a complex task that requires skilled programmers. Moreover, this is a rather inflexible approach. Compression algorithms are not easily modified or replaced once they have been incorporated into a database. As new data types are added or as compression requirements change, compression algorithms must also change. The installed compression algorithms may not be adaptable or able to accommodate the changes, and different compression schemes may be required. Additionally, users may wish to apply different types of compression to different data types and to different data organizations, such as in rows or columns of a table. To enable this it is necessary to incorporate the different compression algorithms into the data store which, as discussed, is a difficult and complex task with currently available databases.

There is a need for approaches that allow users of shared data stores the ability to incorporate easily a variety of arbitrary custom or special-purpose data conversion schemes such as compression schemes into large data stores and to apply selectively the different data conversion schemes to data. There is also a need as well as to change or modify available data conversion schemes as needs change. It is desirable to provide systems and methods that address these and other needs and problems associated with presently available data store data conversion approaches, and it is to these ends that the present invention is directed.

DESCRIPTION OF PREFERRED EMBODIMENTS

The invention is particularly well adapted for use in a shared nothing data store system and will be described in that context. However, as will be appreciated, this is illustrative of only one utility of the invention and it may be used in different types of database systems.

Figure 1:
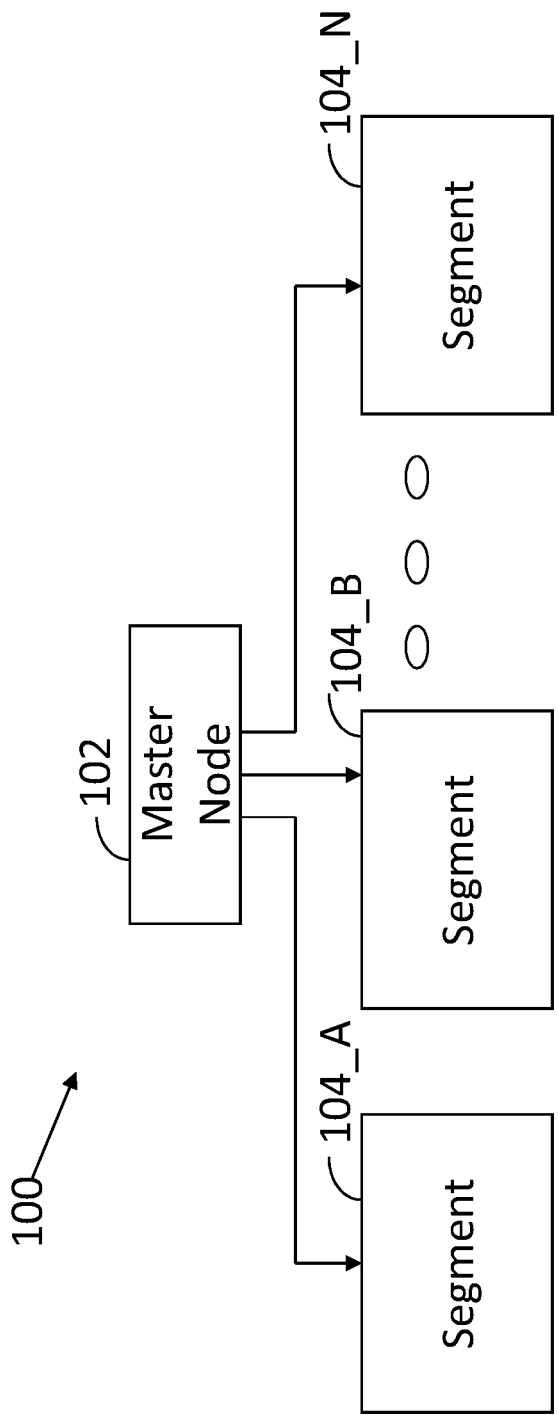
FIG. 1 is a diagrammatic view of a shared data store of the type with which the invention may be used.

FIG. 1 illustrates the architecture of a shared-nothing massively parallel processing data store (database) system 100 of the type with which the invention may be employed. The system may comprise a cluster of distributed processing nodes that include a master node 102 which connects to a plurality of segment nodes 104_A through 104_N that form a distributed parallel data store. The master and segment nodes may comprise generally similar server applications, each having a process model similar to a standalone server that is augmented with extensions for use in a distributed system, such as data distribution, remote process communications, and data retention. User data is distributed across the segment nodes for parallel storage and access.

Figure 2:
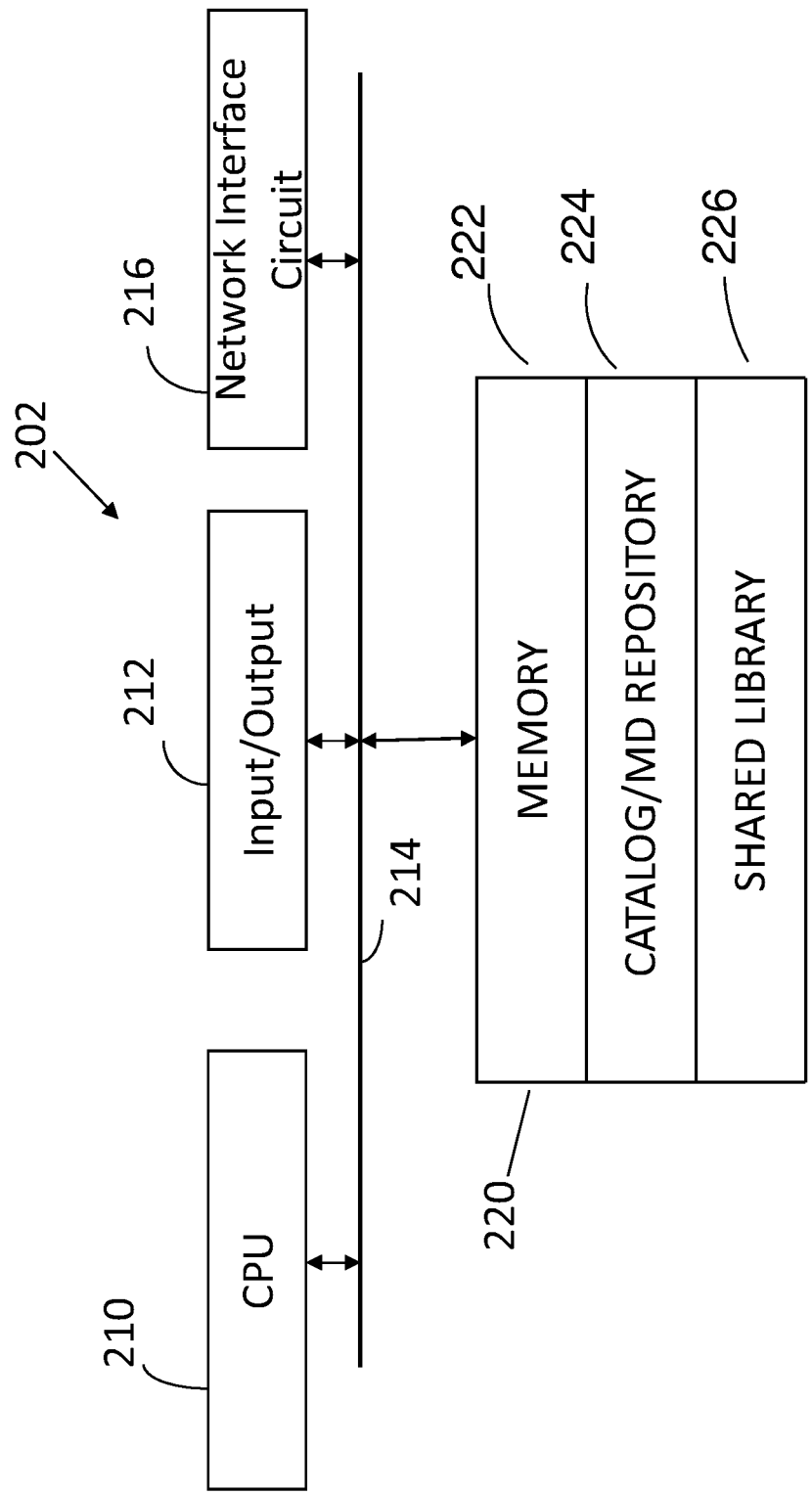
FIG. 2 is a diagrammatic view of a node of the shared data store of FIG. 1.

FIG. 2 illustrates the architecture of an exemplary master node 202 of the database system that is configured to perform processes and operations in accordance with the invention. The master node and the segment nodes may have substantially the same architectures. The master node 202 may comprise a host computer server system 210 (which may comprise a single CPU or may be a multi-processor system comprising a plurality of CPUs) connected to input/output (I/O) devices 212 by a communications bus 214. The I/O devices may be standard computer system input and output devices. A network interface circuit 216 may also be connected to bus 214 to allow the master node to operate in the networked environment of the database of FIG. 1. The master node may further have storage 220 comprising non-transitory physical storage media connected to the bus that stores data and embodies executable instructions to control the operations of the computer system. Storage 220 may include a main memory 222 comprising instructions that control the CPU to operate in accordance with the invention, as will be described, application programs, and may contain other storage for storing, among other things, a catalog/metadata repository 224, and a shared library 226 storing object code compression functions. The catalog in a database, as is well known, stores metadata describing the structure, parameters and logical attributes of user data and database objects such as application programs. The catalog and the shared library are universally available to all nodes in the data store system.

The invention enables a user to define and register a plurality of different data conversion algorithms that apply different types of data conversion operations, such as different types of compression and decompression, to data, and enables the user to apply selectively the different types of conversion to data entered into or retrieved from the data store. As used herein, a data conversion algorithm refers to a process for converting the representation or expression of data from one form to another, where the conversion can be described mathematically. Although the invention will be described herein in the context of compression and decompression algorithms, it will be apparent from the description that the invention is also applicable to other types of data conversion operations, such as data encryption and decryption, and that the invention more generally permits database users to design, implement and apply custom special-purpose data conversion algorithms for specific purposes.

As will be described, the invention enables database users to define arbitrarily different types of compression schemes and other data conversion operations, register the compression schemes in the database system, and utilize the compression schemes to compress and decompress data stored in and retrieved from the database. Briefly summarized, each user-defined compression (and decompression) algorithm is composed of and expressed in terms of a plurality of functions represented in the database as objects. The user may define the functions and implementation logic and parameters for these functions for a particular user-defined algorithm, and store executable object code implementations of these functions in the shared library in the database system with a global reference symbol or label that identifies the user-defined algorithm and that ties the functions together as a group for that particular algorithm. The global reference symbol serves as a pointer to the object code implementations of the functions in the shared library. The user may create the functions using the database language (e.g., SQL) syntax and the global reference symbol, and register each of the functions with their global reference in the database catalog. Once the functions and algorithm are registered in the catalog, the user may utilize that compression algorithm to compress data entered into the database and its corresponding decompression algorithm to decompress compressed data retrieved from the database.

As noted, the invention employs a plurality of functions to express compression/decompression algorithm. In one embodiment, the group of functions comprises a constructor, a destructor, a compressor, a decompressor and a validator. The functions mathematically express the properties and states of a given compression and decompression algorithm and validate user supplied input parameters. A constructor is well known as a special type of operation used in programming to create and initialize an object for use. It is used by the invention in the database context in a novel way to initialize and create a state for the compression and decompression algorithms by establishing parameters for the arguments of the functions of the compression and decompression algorithms. The destructor function destroys the state as part of deinitialization of the compression algorithm. The compressor and decompressor functions respectively identify the data to be compressed or decompressed, the type of compression and decompression algorithms, and the parameters of the compression and decompression algorithms. The validator function validates the user-defined parameters supplied to the compression algorithm by determining whether the parameters are valid and appropriate to the algorithm.

Figure 3:
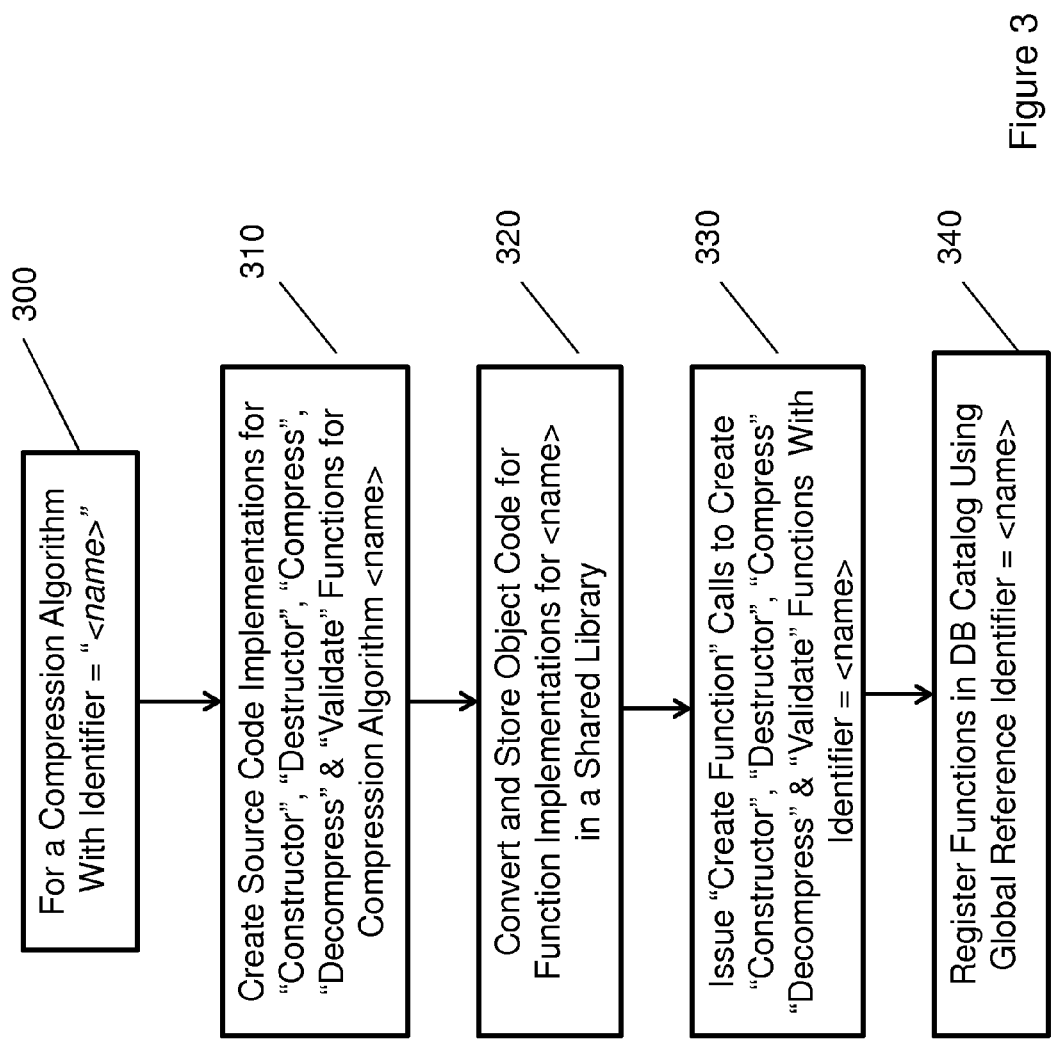
FIG. 3 is a diagrammatic view illustrating a process for incorporating into and registering a compression algorithm in a data store.

FIG. 3 illustrates a process in accordance with the invention for defining, incorporating and registering a user-defined compression algorithm into a database. As indicated in the figure at 300, the illustrated process is performed for each different user-defined compression algorithm that is incorporated into the database. Each compression algorithm will have a global identifier symbol or label "<name>" by which it will be referenced. At 310, the constructor, destructor, compressor, decompressor and validate functions for a particular compression algorithm <name> may be defined, and the implementation of each function expressed in source code.

Assuming a compression algorithm having an identifier label "<name>"="My", sample code for an implementation of the functions in accordance with one embodiment may be as follows:

```
Constructor:
    void *
    my_constructor(...)
    {
    MyState *ms = (MyState *)malloc(sizeof(MyState));
    if (!ms) return NULL;
    ms->descriptor = arg1;
    ms->level = arg2[0];
    ms->bufsize = arg2[1];
    ms->scratch = malloc(ms->bufsize);
        return (ms);
    }
Destructor:
    void
    my_destructor(...)
    {
        free(ms);
    }
Compressor:
    void
    my_compressor(...)
    {
        d_compress(ms->level, arg1, arg2, arg3, ms->scratch);}
```

The arguments "arg1", "arg2[0]", etc., of the constructor function, my_constructor, comprise variables for input parameters that define the state for the My algorithm compressor and the decompressor functions. The input parameters may include, for instance, a descriptor of the input data, the compression level to be applied, and buffer sizes based upon the input data and compression level. These same arguments also define the parameters of the compressor function, my_compressor, as well as a corresponding decompressor function, my_decompressor, which would take the same form as my_compressor for the function do_decompress( . . . ). The validator function corresponding to the compressor function is defined based upon the appropriateness of the input parameters for the particular My compression algorithm. For instance, if the compressor function had a selectable data compression level in the range of 1 to 9, the validator function would indicate that an input level value of 10 was inappropriate.

Returning to FIG. 3, at 320 the source code for the implementations of the constructor, destructor, compressor, decompressor and validator functions for the particular "My" compression algorithm is converted to object code which is stored in a shared library that is accessible to the master and all segments. Next, at 330 database objects corresponding to the above functions are created and registered in the database catalog. This may be accomplished using the database language, e.g., SQL, syntax by issuing CREATE FUNCTION calls with the global identifier reference "My" for each of the functions constructor, destructor, compressor, decompressor and validator to create database objects "my_constructor", "my_destructor", "my_compressor", "my_decompressor" and "my_validator". The CREATE FUNCTION commands register each of the objects in the database catalog with the global reference label "My" tying them together as a group. Once registered in the catalog, the group of objects may be universally referenced and used by the database nodes for compressing or decompressing data using the My compression/decompression algorithms. As will be appreciated, the process of FIG. 3 may be repeated to define and register other compression algorithms in the database catalog under their respective global reference identifiers so that they are also available for applying other types of compression to data.

Figure 4:
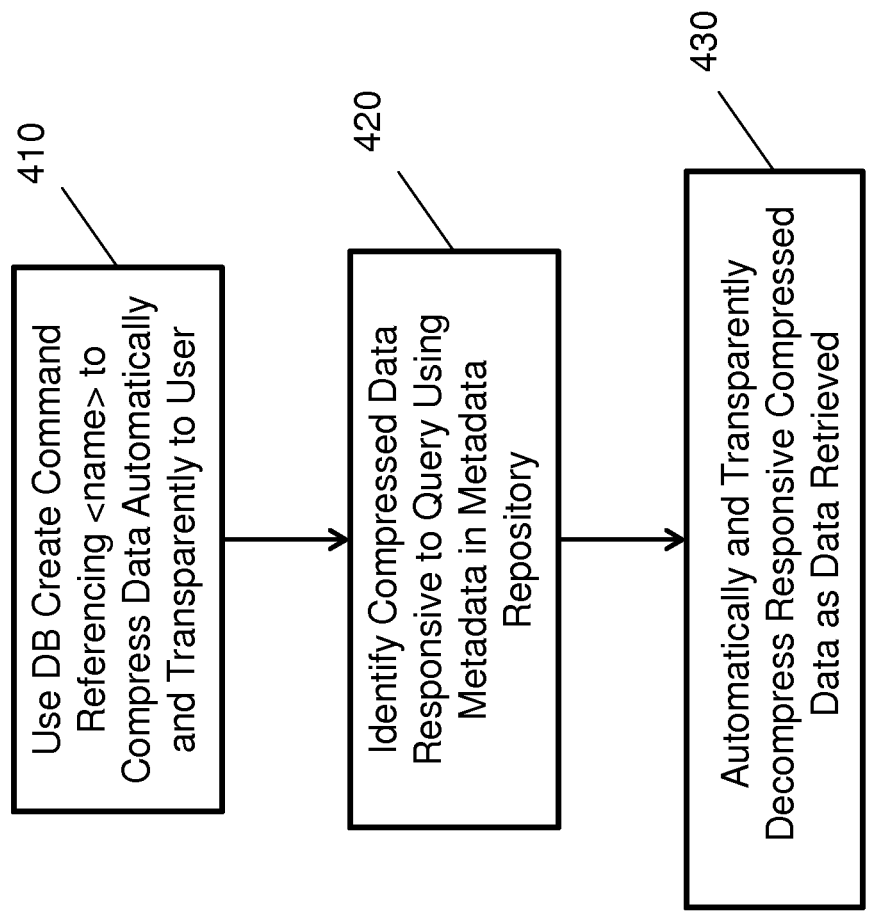
FIG. 4 is a diagrammatic view illustrating a process for using a registered compression algorithm in the data store.

FIG. 4 illustrates a process for using user-defined compression algorithms registered in the catalog for compressing and decompressing data. Data entered into the database is compressed automatically and transparently to the user as it is entered, and decompressed automatically and transparently as it is retrieved. Referring to FIG. 4, in one embodiment data entered into the database may be compressed using a database CREATE command, as indicated at 410. For instance, a table may be created using the database language syntax for CREATE TABLE. As part of the CREATE TABLE command a compression type may be specified, e.g., "compressiontype=My", as part of the table parameters. Then as data is entered into the table, it will then be automatically and transparently compressed using the My compression algorithm. In addition, if the My compression algorithm has selectable parameters, such as different compression levels or a particular block size, for instance, the CREATE TABLE command may also incorporate statements such as "compressionlevel=n", where "n" is the selected compression level, and "blocksize=m", where "m" is the selected block size. Then, data entered into the tables will be compressed according to the values of the parameters.

Typically, all user data in the database is stored in tables, and the stored user data is characterized by metadata that is stored in the metadata repository 224, which is part of the catalog. When queries are run on the database, they are run against the metadata. The metadata is used to identify user data that is responsive to a query, as indicated at 420, and the responsive data is retrieved and analyzed against the query. If the identified data being retrieved is compressed, it is automatically and transparently decompressed on-the-fly as it is retrieved, as indicated at 430, by applying the decompressor function as part of the retrieval command so that the uncompressed data may be analyzed against the query.

From the foregoing, it can be seen that the invention advantageously enables a variety of arbitrary user-defined compression and decompression algorithms to be easily incorporated into a database and registered in the database catalog so that they may be selectively applied by the user to compress data. Moreover, once different compression algorithms are available for use in a database. It will be appreciated that the invention makes it possible to utilize the different algorithms selectively to compress and decompress data based upon a characteristic of the data, such as data type.

From the foregoing, it will be apparent that the invention has more general applicability in that it may be used to incorporate into and register in a database other types of data conversion functions and algorithms. For instance, encryption and decryption algorithms are analogous to compression and decompression algorithms since they also encode and decode data, and they offer similar advantages in a database. The structures, functions and operations of encryption/decryption algorithms are similar to those of compression/decompression algorithms, and encryption/decryption algorithms are applied to and operate on data in similar ways as compression/decompression algorithms. Encryption algorithms may be used for encrypting, for example, financial and/or personal data in a credit processing database, and health records in a medical database. Thus, it will be apparent to those skilled in the art from the foregoing that the invention may be used also to incorporate and register arbitrary encryption and decryption functions into a data store and catalog using the same processes and procedures of the invention described herein to incorporate and register compression and decompression functions. Object code representations of constructor, destructor, encryption, decryption and validate functions may be defined and stored in the shared library in a similar way to that described above, CREATE FUNCTION calls may be issued for each of the functions to create corresponding database function objects and register them in the catalog, and the encryption and decryption algorithms may be selectively applied to data in a similar way to compression and decompression algorithms.

While the foregoing has been with respect to particular embodiments of the invention, it will be appreciated by those skilled in the art that changes to these embodiments may be made without departing from the principles and spirit of the invention, the scope of which is defined by the appended claims.

The invention claimed is:

1. A computer-implemented method of defining and registering a user-defined data conversion algorithm in a shared data store of a distributed database system for selective use on data entered into or retrieved from the database system, comprising:

defining by a user a plurality of functions that comprise and mathematically express operations of the user-defined data conversion algorithm, said defining comprising defining implementations and parameters for each of said functions, each of the functions having associated arguments corresponding to said parameters, and wherein said data conversion algorithm comprises one of data compression, data decompression, data encryption or data decryption;

converting by the computer the implementations for each of the plurality of functions into separate executable code objects, each code object comprising an implementation of one of said plurality of functions and having associated parameters of an argument of said one of said plurality of functions, and storing said code objects and said associated parameters in a shared library of the data store with a common global identifier that uniquely identifies the user-defined data conversion algorithm and ties together each of said code objects as corresponding to implementations of said one of said functions of the user-defined data conversion algorithm;

registering each of said code objects and said associated parameters in a catalog of the data store with said common global identifier to enable said code objects and said associated parameters corresponding to an implementation of a function of said data conversion algorithm to be separately and selectively accessed, changed and applied to the data by a user; and further comprising automatically and transparently converting data entered into or retrieved from the data store using said data conversion algorithm in response to a data conversion statement referencing the common global identifier in data store commands to enter data into and retrieve data from the data store.

2. The method of claim 1, wherein said plurality of functions comprises a constructor function, the constructor function initializing and creating a state for the data conversion algorithm by establishing said parameters for arguments of said plurality of functions.

3. The method of claim 2, wherein the plurality of functions further comprise a destructor function for destroying the state and deinitializing the data conversion algorithm.

4. The method of claim 2, wherein the plurality of functions further comprise a validator function that validates user selected input parameter values supplied to the data conversion algorithm by determining whether said input parameter values are valid and appropriate to the algorithm.

5. The method of claim 1, wherein for said data compression or decompression algorithm, said plurality of functions comprise a compressor function or a decompressor function that define corresponding compression and decompression operations, respectively, and applicable parameters of functions of the compression or decompression algorithm, said applicable parameters of said functions comprising user selectable compression and decompression levels.

6. The method of claim 5, wherein said applicable parameters comprise a data descriptor of the input data, and buffer sizes based upon the input data and the user selected compression and decompression levels.

7. The method of claim 5, wherein said common global identifier identifies a particular one of several different data compression algorithms registered in said data store and the corresponding plurality of functions that define and comprise said one data compression algorithm.

8. The method of claim 1, wherein for said data encryption or decryption algorithm, said plurality of functions comprise an encryptor function or a decryptor function that define corresponding encryption and decryption operations, respectively, and applicable parameters of the encryption or decryption algorithm.

9. The method of claim 1, wherein said registering each of said code objects comprises registering a code object corresponding to an implementation of each of said functions in response to a CREATE FUNCTION command for each of said functions.

10. Computer readable non-transitory media for storing executable instructions for controlling the operation of a computer to perform a method of defining and registering a user-defined data conversion algorithm in a shared data store of a distributed database system for selective use on data entered into or retrieved from the database system, the method comprising:
- defining by a user a plurality of functions that comprise and mathematically express operations of the user-defined data conversion algorithm, said defining comprising defining implementations and parameters for each of said functions, each of the functions having associated arguments corresponding to said parameters, and wherein said data conversion algorithm comprises one of data compression, data decompression, data encryption or data decryption;
- converting by the computer the implementations for each of the plurality of functions into separate executable code objects, each code object comprising an implementation of one of said plurality of functions and having associated parameters of an argument of said one of said plurality of functions, and storing said code objects in a shared library of the data store with a common global identifier that uniquely identifies the user-defined data conversion algorithm and ties together each of said code objects as corresponding to said one of said functions of the user-defined data conversion algorithm;
- registering each of said code objects and said associated parameters in a catalog of the data store with said common global identifier to enable said code objects and said associated parameters to be separately and selectively accessed, changed and applied to the data by a user; and
- further comprising automatically and transparently converting data entered into or retrieved from the data store using said data conversion algorithm in response to a data conversion statement referencing the common global identifier in data store commands to enter data into and retrieve data from the data store.

11. The computer readable media of claim 10, wherein said plurality of functions comprises a constructor function, the constructor function initializing and creating a state for the data conversion algorithm by establishing said parameters for arguments of said plurality of functions.

12. The computer readable media of claim 11, wherein the plurality of functions further comprise a destructor function for destroying the state and deinitializing the data conversion algorithm.

13. The computer readable media of claim 11, wherein the plurality of functions further comprise a validator function that validates user selected input parameter values supplied to the data conversion algorithm by determining whether said input parameter values are valid and appropriate to the algorithm.

14. The computer readable media of claim 10, wherein for said data compression or decompression algorithm, said plurality of functions comprise a compressor function or a decompressor function that define corresponding compression and decompression operations, respectively, and applicable parameters of functions of the compression or decompression algorithm, said applicable parameters comprising user selected compression and decompression levels.

15. The computer readable media of claim 14, wherein said applicable parameters comprise a data descriptor of the input data, and buffer sizes based upon the input data and the user selected compression and decompression levels.

16. The computer readable media of claim 14, wherein said common global identifier identifies a particular one of several different data compression algorithms registered in said data store and the corresponding plurality of functions that define and comprise said one data compression algorithm.

17. The computer readable media of claim 10, wherein for said data encryption or decryption algorithm, said plurality of functions comprise an encryptor function or a decryptor function that define corresponding encryption and decryption operations, respectively, and applicable parameters of the encryption or decryption algorithm.

18. The computer readable media of claim 10, wherein said registering each of said code objects comprises registering each code object corresponding to an implementation of each of said functions in response to a CREATE FUNCTION command for each of said functions.

* * * * *